(12) United States Patent
Vogt

(10) Patent No.: US 7,183,638 B2
(45) Date of Patent: Feb. 27, 2007

(54) EMBEDDED HEAT SPREADER

(75) Inventor: Pete D. Vogt, Boulder, CO (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/027,291

(22) Filed: Dec. 30, 2004

(65) Prior Publication Data

US 2006/0145320 A1 Jul. 6, 2006

(51) Int. Cl.
*H01L 23/02* (2006.01)
(52) U.S. Cl. .............. 257/686; 257/685; 257/777; 257/678; 438/108; 438/109; 361/760
(58) Field of Classification Search ............ 257/777, 257/686, E27.137, E27.144, E7.161, 685, 257/678, E27.161; 361/760; 438/108, 109
See application file for complete search history.

(56) References Cited

U.S. PATENT DOCUMENTS

| | | | |
|---|---|---|---|
| 3,574,818 A | | 4/1971 | Takehara et al. |
| 4,547,570 A | | 10/1985 | Garner |
| 4,650,716 A | | 3/1987 | Gelman |
| 4,689,408 A | | 8/1987 | Gelman et al. |
| 4,975,761 A | * | 12/1990 | Chu ............ 257/686 |
| 5,763,939 A | * | 6/1998 | Yamashita ......... 257/668 |
| 5,861,666 A | | 1/1999 | Bellaar ............ 257/686 |
| 6,020,629 A | * | 2/2000 | Farnworth et al. ..... 257/686 |
| 6,093,969 A | * | 7/2000 | Lin ............ 257/777 |
| 6,122,171 A | * | 9/2000 | Akram et al. ........ 361/704 |
| 6,130,477 A | * | 10/2000 | Chen et al. ......... 257/712 |
| 6,188,127 B1 | * | 2/2001 | Senba et al. ......... 257/686 |
| 6,218,731 B1 | * | 4/2001 | Huang et al. ........ 257/738 |
| 6,278,616 B1 | * | 8/2001 | Gelsomini et al. ...... 361/803 |
| 6,380,620 B1 | * | 4/2002 | Suminoe et al. ....... 257/706 |
| 6,420,782 B1 | * | 7/2002 | Eng et al. .......... 257/686 |
| 6,472,727 B2 | * | 10/2002 | Miyazaki et al. ...... 257/668 |
| 6,493,229 B2 | * | 12/2002 | Akram et al. ........ 361/704 |
| 6,538,895 B2 | * | 3/2003 | Worz et al. ......... 361/735 |
| 6,577,013 B1 | * | 6/2003 | Glenn et al. ........ 257/777 |

(Continued)

FOREIGN PATENT DOCUMENTS

JP 11145345 5/1999

(Continued)

OTHER PUBLICATIONS

Barbucci R et al., Swelling behavior of carboxymethylcellulose hydrogels in relation to cross-inking, pH and charge density, *Macromol 33*: 7475-7480 (2000).

(Continued)

*Primary Examiner*—Kenneth Parker
*Assistant Examiner*—Chris C. Chu
(74) *Attorney, Agent, or Firm*—Marger Johnson & McCollom, P.C.

(57) ABSTRACT

An embedded heat spreader includes a semiconductor die, an elastomer layer attached to the die, a tape lead attached to the elastomer, a portion of the tape lead exposed through the elastomer to connect with the die, a polymer resin attached to the tape lead, and a thermally conductive substrate attached to the polymer resin such that the thermally conductive substrate can spread heat from the semiconductor die.

10 Claims, 3 Drawing Sheets

U.S. PATENT DOCUMENTS

| | | | |
|---|---|---|---|
| 6,593,468 B1 | 7/2003 | Lange et al. | |
| 6,646,334 B2 * | 11/2003 | Hur | 257/686 |
| 6,664,649 B2 * | 12/2003 | Huang | 257/796 |
| 6,765,042 B1 | 7/2004 | Thornton et al. | |
| 6,897,565 B2 * | 5/2005 | Pflughaupt et al. | 257/777 |
| 2003/0174478 A1 | 9/2003 | Stefano et al. | 361/760 |

FOREIGN PATENT DOCUMENTS

WO    WO 03/019654    3/2003

OTHER PUBLICATIONS

Heinze et al., "Studies on the synethsus and characterization of carboxymethylcellulose," *Die Ang Makro Chem 266*: 37-45 (1999).

Kalman et al., "Effect of the reaction conditions on the degree of substitution of carboxymethyl cellulose," *Colloid Polym Sci 266*: 716-720 (1999).

Klemm et al., Etherization of Cellulose, "*Comprehensive Cellulose Cehmistry, vol. 2: Functionalization of Cellulose,*"and Appendix, p. 353, Wiley-VCH (2001).

Zhang et al, "Solvent effect on carboxymethylation of cellulose,"*J Appl Poly Sci 49*: 741-746 (1993).

English language abstract of Japanese Publication No. 11145345, vol. 1999, No. 10 (Aug. 31, 1999).

* cited by examiner

EMBEDDED HEAT SPREADER

BACKGROUND

Semiconductor technology has sustained significant improvements over the last few decades. The concurrent increase in complexity and shrinking scale of semiconductors has generated its own law, Moore's Law, relating the exponential growth in the number of transistors per integrated circuit. These gains necessitated a similar growth in many related industries such as the semiconductor packaging industry.

Semiconductors generate heat while operating. If the heat is not dissipated, it may damage a semiconductor or cause it to malfunction. As transistor density in semiconductor packages increases, heat dissipation becomes an issue.

Substrates and packages affect semiconductor performance in many ways. Integrated circuits are often packaged and typically reside in or on a substrate. Electrical, thermal and mechanical considerations are relevant to substrate and package design. For example, substrates and packages remove heat from a integrated circuit while also providing power and signaling.

Semiconductors may be packaged in a stacked configuration. Stacked configurations generally have heightened requirements for providing power and signaling to a semiconductor as well as for dissipating heat.

DETAILED DESCRIPTION

In the following description, numerous specific details are set forth. However, it is understood that embodiments of the inventions may be practiced without these specific details. In other instances, well-known circuits, structures, and techniques have not been shown in detail in order to not obscure the understanding of this description.

Reference in the specification to "one embodiment" or "an embodiment", etc., means that a particular feature, structure, or characteristic described in connection with the embodiment is included in at least one aspect of the invention. The appearances of the phrase "in one embodiment" in various places in the specification do not necessarily all refer to the same embodiment. The following describes at least an improvement for thermal performance of a semiconductor device and for multiple devices in a multi-die stacked package.

Generally, a typical substrate material used in semiconductor packages may be replaced with a laminate of materials that improves the conduction of heat out of a semiconductor die. For example, a copper base-substrate with a single layer polyimide layer bonded to the substrate can conduct heat off of the die. In this example, a copper routing layer can then be bonded to the other side of the polyimide to complete an interconnect substrate. The interconnect substrate can provide a routing layer to distribute signals to a semiconductor die and the interconnect is insulated from a thermally conductive substrate by the polyimide layer. An embodiment may improve the thermal capability of a semiconductor device and interconnect electrical performance.

Figure 1:
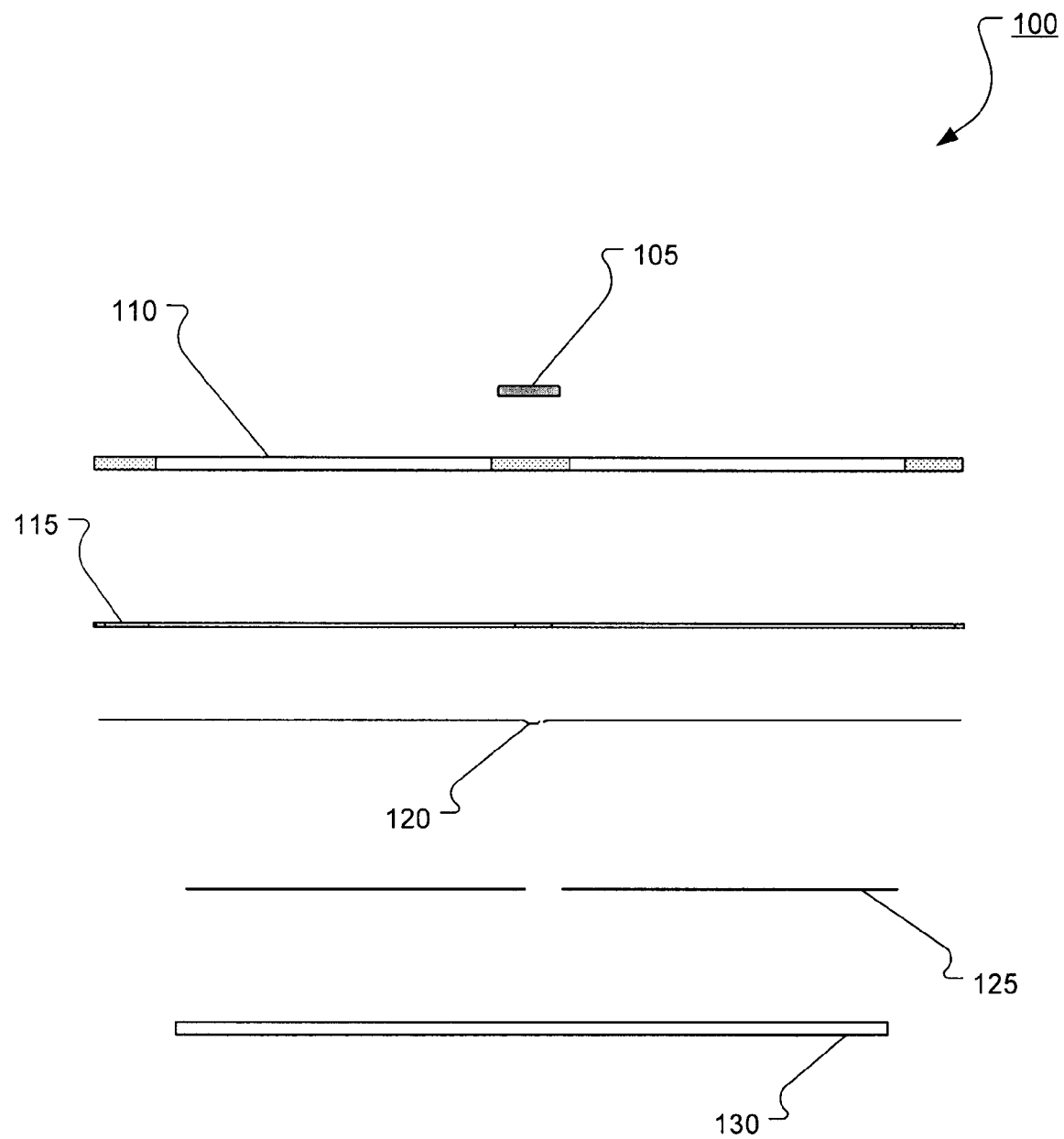
FIG. 1 is an exploded view of the assembly layers using the copper substrate.
Figure 2:
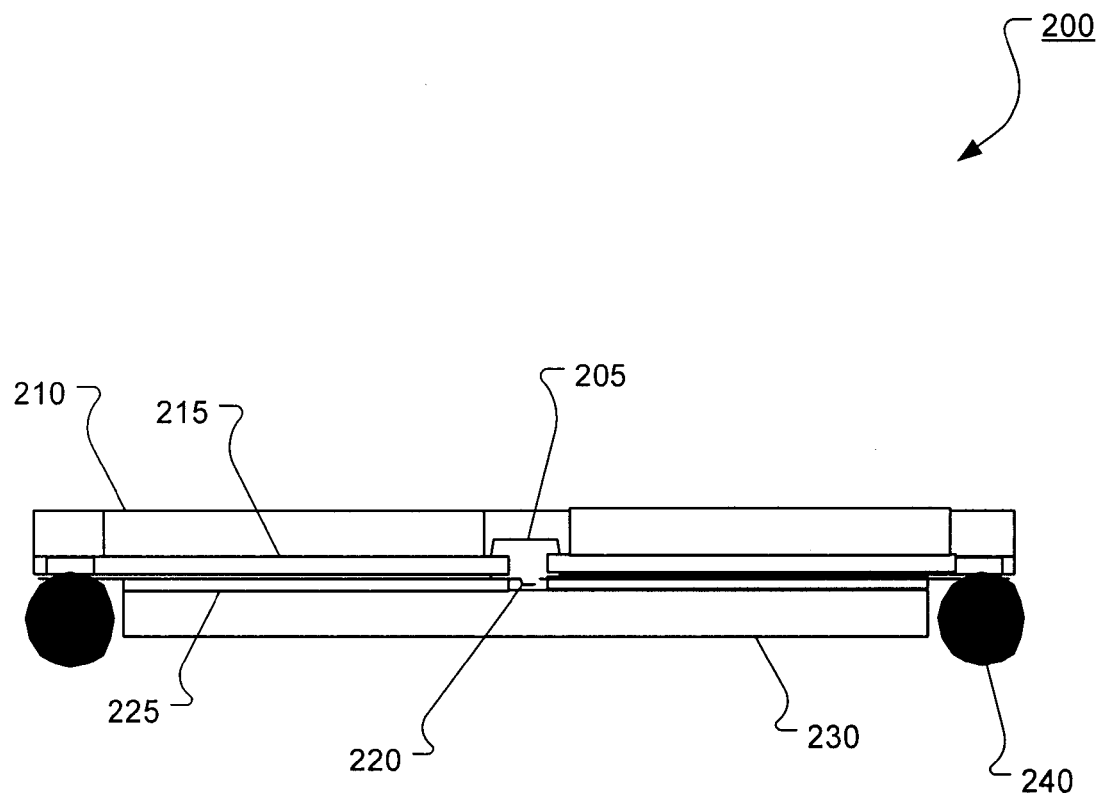
FIG. 2 is an example of the single die assembly using the copper substrate.
Figure 3:
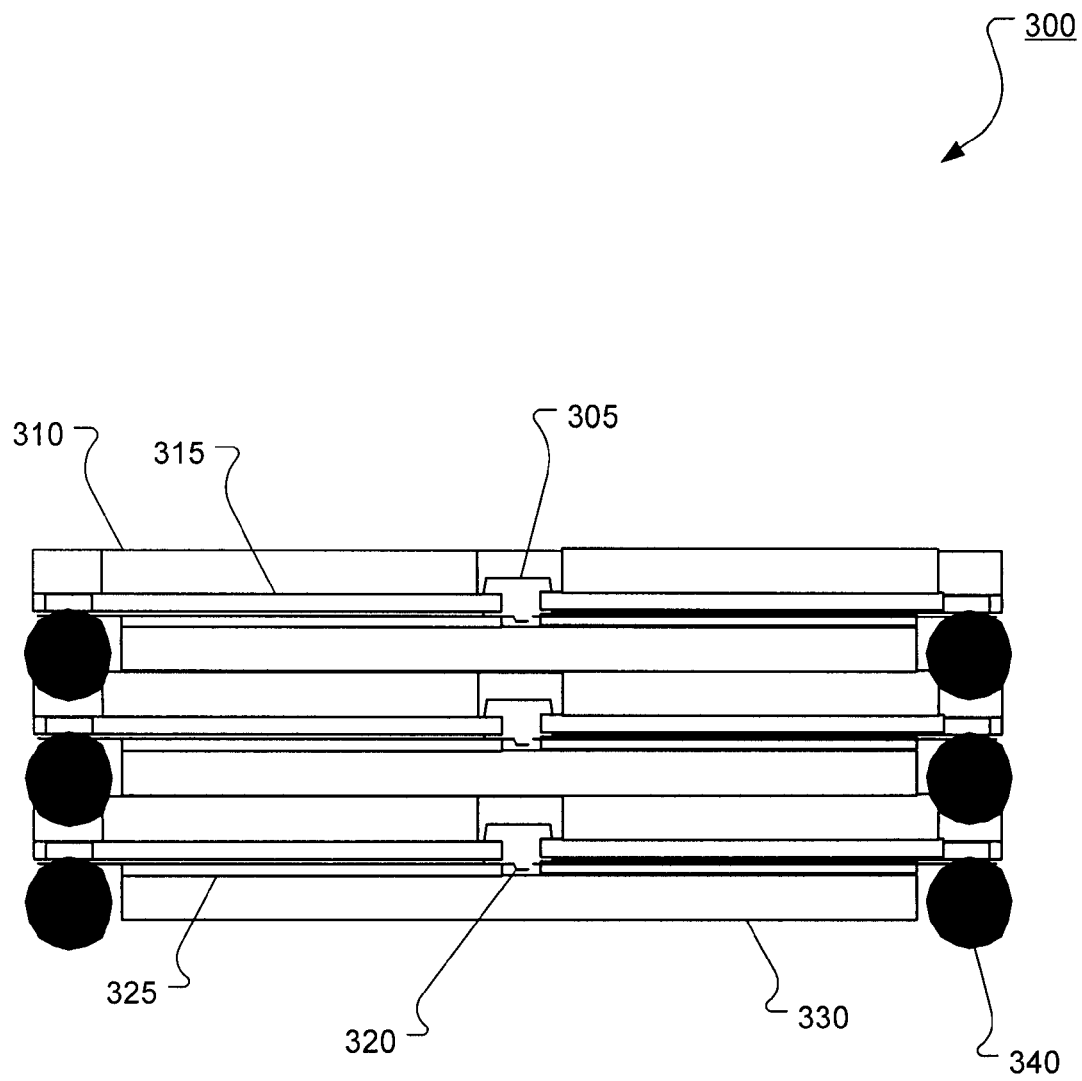
FIG. 3 is an example of the multiple die assembly using the copper substrate.

FIGS. 1–3 show DRAM and DRAM stacked package embodiments to illustrate a substrate and package as explained herein. DRAMs are used here for illustration purposes, but embodiments of the invention are not restricted for use with any specific semiconductor devices or circuits. These embodiments may introduce a thermal conductor into a device stack to conduct heat from a buried DRAM die to the edge of the stacked package. At the package edge, signal interconnect solder bumps or other interconnections can transport heat to a surface of the DRAM stack and to a system substrate where heat can be dissipated. A copper substrate may also connect to ground and act as a ground reference for high-speed signals. In the present embodiment, this ground reference improves signal integrity of the DRAM signals.

FIG. 1 is an exploded view of the assembly layers of a semiconductor package 100 that uses a thermal conducting substrate 110. In the present embodiment the thermal conducting substrate 110 comprises copper although any substrate material may be used so long as it has an sufficiently high thermal conductivity. In an embodiment the thermal conducting substrate is a laminate of materials with one or any combination of the materials having a sufficiently high thermal conductivity to allow the substrate to operate as a thermally conductive substrate to spread heat from a semiconductor die.

Referring to FIG. 1, the exploded view includes a backing film substrate 115 such as a polyimide tape to bond to the thermal conducting substrate 110. This is just an example, however, any other materials suitable for a backing film substrate may be used. A routing layer such as tape lead 120 is adjacent to the backing film substrate 115 and on the opposite side of the backing film substrate 115 from the thermal conducting substrate 110. In an embodiment the routing layer is copper, yet any conductive material may be used.

The present embodiment has an elastomer layer 125 sandwiched between a tape lead 120 and a semiconductor die 130. The elastomer layer 125 absorbs stress from thermal expansion. The elastomer layer 125 may have openings where the tape lead 120 can connect with the semiconductor die 130. Elastomers are typically polymeric material that may experience large and reversible elastic deformations and are used to absorb stress between layers that may have different coefficients of thermal expansion. Additionally, the present embodiment uses a DRAM die as the semiconductor die 130. Any semiconductor may be used in semiconductor die 130 and be in accordance with the principles of this disclosure. In an embodiment a molded compound 105 may be attached to the conducting substrate 110 as shown in FIG. 1.

FIG. 2 illustrates a single die assembly 200 consisting of the assembly layers from FIG. 1 resulting in a semiconductor package that uses a thermal conducting substrate 210. In the present embodiment the thermal conducting substrate 210 comprises copper although any substrate material may be used so long as it has a sufficiently high thermal conductivity. In an embodiment the thermal conducting substrate is a laminate of materials with one or any combination of the materials having a sufficiently high thermal conductivity to allow the substrate to operate as a thermally conductive substrate to spread heat from a semiconductor die. A thermal conducting 210 substrate may also connect to ground and act as a ground reference for high-speed signals.

In the present embodiment, this ground reference improves signal integrity of the DRAM signals.

Referring to FIG. 2, the assembly 200 includes a backing film substrate 215 such as a polyimide tape that is bonded to the thermal conducting substrate 210. However, any other materials suitable for a backing film substrate may be used. A routing layer such as tape lead 220 is connected to the backing film substrate 215 and on the opposite side of the backing film substrate 215 from the thermal conducting substrate 210. In an embodiment the routing layer is copper, yet any conductive material may be used. The present embodiment also includes solder balls 240 attached to the tape lead 220 at the edge of the assembly 200 and structurally supported by the thermal conducting substrate 210 and the backing film substrate 215. The solder balls 240 may be any other material suitable for electrical interconnection.

The present embodiment has an elastomer layer 225 sandwiched between a tape lead 220 and a semiconductor die 230. The elastomer layer 225 absorbs stress from thermal expansion. In the present embodiment the elastomer layer 225 has openings where the tape lead 220 is connected to the semiconductor die 230. Additionally, the present embodiment uses a DRAM die as the semiconductor die 230. Any semiconductor may be used in semiconductor die 230 and be in accordance with the principles of this disclosure. In an embodiment a mold compound 205 may be attached to the conducting substrate 210 as shown in FIG. 2.

FIG. 3 shows an embodiment multiple die assembly 300 using thermal conducting substrates placed between semiconductor dies such as semiconductor die 130 from FIG. 1. In an embodiment the thermal conducting substrates are each a laminate of materials with one or any combination of the materials having a sufficiently high thermal conductivity to allow the substrate to operate as a thermally conductive substrate to spread heat from a semiconductor die. The multiple die assembly 300 may consist of multiple assemblies 200 from FIG. 2. The embodiment multiple die assembly 300 in FIG. 3 is a stacked configuration including multiple thermally conducting substrates.

In the present embodiment the thermal conducting substrates 310 comprise copper although any substrate material may be used so long as it has an sufficiently high thermal conductivity. A thermal conducting 310 substrate may also connect to ground and act as a ground reference for high-speed signals. Again, this ground reference improves signal integrity to and from any of the semiconductor dies 330.

The multiple die assembly 300 in FIG. 3 includes an elastomer layer 325 in between semiconductor dies and adjacent thermal conductive substrates. Similar to the embodiment illustrated in FIG. 2, a routing layer such as tape lead 320 is connected to the backing film substrate 315 and on the opposite side of the backing film substrate 315 from the thermal conducting substrate 310. The embodiment multiple die assembly 300 also includes connecting balls such as solder balls 340 connecting adjacent assemblies in the multiple die assembly 300. Solder balls 340 are used in the present embodiment but the connecting balls may be any other material suitable for electrical interconnection.

Referring to FIG. 2, the thermally conductive substrate and semiconductor die assembly may be manufactured by the following method. A polymer resin may be adhered to a thermally conductive substrate. In the present embodiment the thermally conductive substrate may be a copper heat spreader, but any suitably heat conductive substrate material may be used. An example polymer resin is a polyimide tape, but embodiments are not limited to use of polyimide tape for the polymer resin.

The method may include attaching a tape lead to the polymer resin. An example tape lead may comprise copper as described in the above apparatus and system, but any material may be used if it can be configured into a routing layer to transport electrical signals. The embodiment method also includes attaching an elastomer to the tape lead. In an embodiment the elastomer has an opening to expose a portion of the tape lead.

The present embodiment includes attaching the elastomer to a die, wherein the die can be any semiconductor die, for example a DRAM die. The method includes attaching the die to the tape lead such as the example embodiment's copper tape lead described above. An embodiment method may further comprise attaching at least one solder ball to the tape lead.

Embodiment methods may include the above method and further comprise forming a second elastomer layer to the exposed side of the die. Additionally, the present embodiment may further comprise attaching the second elastomer layer to an adjacent heat spreader. In an embodiment these methods may be repeated, thus creating a stacked assembly with multiple heat spreaders.

The present invention may be embodied in other specific forms without departing from its spirit or essential characteristics. The described embodiments are to be considered in all respects only as illustrative instead of restrictive or limiting. Therefore, the scope of the invention is indicated by the appended claims rather than by the foregoing description. All changes, modifications, and alterations that come within the meaning, spirit, and range of equivalency of the claims are to be embraced as being within the scope of the appended claims.

The invention claimed is:

1. An apparatus comprising:
   an elastomer layer having openings to attach to a semiconductor die;
   a routing layer attached to the elastomer layer such that the routing layer electrically connects to the semiconductor die through the openings in the elastomer layer;
   a polymer resin attached to the routing layer;
   a thermally conductive and structurally supportive substrate attached to the polymer resin, the thermally conductive substrate to spread heat; and
   at least one solder ball interconnect attached to the thermally conductive substrate on the same side of the thermally conductive substrate as the semiconductor die.

2. The apparatus of claim 1 wherein the die is a DRAM.

3. The apparatus of claim 1 wherein the polymer resin is a polyimide tape.

4. The apparatus of claim 1 wherein the thermally conductive substrate is a copper substrate.

5. The apparatus of claim 1 wherein the thermally conductive substrate further comprises an electrical ground reference for the die.

6. The apparatus of claim 1 wherein the thermally conductive substrate is a laminate of multiple materials.

7. The apparatus of claim 1 further comprising, the at least one solder ball interconnect attached to the thermally conductive substrate.

8. A system comprising:
   a first apparatus; and
   a second apparatus arranged in a stack apparatus with the first apparatus, each apparatus comprising:
      an elastomer layer having openings to attach to a semiconductor die;

a routing layer attached to the elastomer layer such that the routing layer electrically connects to the semiconductor die through the openings in the elastomer layer;

a polymer resin attached to the tape lead;

a thermally conductive and structurally supportive substrate attached to the polymer resin, the thermally conductive substrate to spread heat; and at least one solder ball interconnect attached to the thermally conductive substrate on the same side of the thermally conductive substrate as the semiconductor die.

9. The system of claim 8 further comprising an elastomer bond between the die of the second apparatus to the thermally conductive substrate of the first apparatus.

10. The system of claim 8 further comprising a printed circuit board attached to the at least one solder ball interconnect of the first apparatus, the printed circuit board to dissipate heat from the stacked configuration.

* * * * *